(12) United States Patent
Yamashita et al.

(10) Patent No.: US 10,564,048 B2
(45) Date of Patent: Feb. 18, 2020

(54) SEMICONDUCTOR DEVICE AND POWER CONVERSION DEVICE

(71) Applicant: Mitsubishi Electric Corporation, Tokyo (JP)

(72) Inventors: Tetsuo Yamashita, Tokyo (JP); Tomohiro Hieda, Tokyo (JP); Hiroki Muraoka, Tokyo (JP); Mituharu Tabata, Tokyo (JP); Koichi Masuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/271,412

(22) Filed: Feb. 8, 2019

(65) Prior Publication Data

US 2020/0011743 A1 Jan. 9, 2020

(30) Foreign Application Priority Data

Jul. 9, 2018 (JP) .................................. 2018-129834

(51) Int. Cl.
*G01K 7/00* (2006.01)
*G01K 7/16* (2006.01)
*H03K 17/567* (2006.01)
*H02M 7/537* (2006.01)
*H01L 29/16* (2006.01)
*H01L 29/20* (2006.01)

(52) U.S. Cl.
CPC .............. *G01K 7/16* (2013.01); *H02M 7/537* (2013.01); *H03K 17/567* (2013.01); *G01K 2217/00* (2013.01); *H01L 29/1602* (2013.01); *H01L 29/1608* (2013.01); *H01L 29/2003* (2013.01)

(58) Field of Classification Search
CPC ..... G01K 7/16; G01K 2217/00; H02M 7/537; H01L 29/1602; H01L 29/1608; H01L 29/2003
See application file for complete search history.

(56) References Cited

U.S. PATENT DOCUMENTS

| | | | | |
|---|---|---|---|---|
| 5,477,076 A | * | 12/1995 | Gay | .......................... G01K 7/01 257/467 |
| 9,929,073 B2 | * | 3/2018 | Kakimoto | ............. H01L 21/822 |
| 2006/0244496 A1 | * | 11/2006 | Kawakita | .............. F02P 3/0552 327/110 |
| 2010/0259313 A1 | * | 10/2010 | Li | .......................... G01K 3/005 327/512 |

FOREIGN PATENT DOCUMENTS

JP 2016-103901 A 6/2016

* cited by examiner

*Primary Examiner* — Dinh T Le
(74) *Attorney, Agent, or Firm* — Studebaker & Brackett PC

(57) ABSTRACT

According to the present invention, a semiconductor device includes a semiconductor chip, resistance of which changes in accordance with temperature, an external resistor connected in series with the semiconductor chip and a detector configured to detect, while a first voltage is applied between both ends of a series circuit formed by the semiconductor chip and the external resistor, a second voltage applied between both ends of the external resistor, wherein the detector calculates a temperature of the semiconductor chip from the second voltage.

14 Claims, 4 Drawing Sheets

■AT LOW TEMPERATURE (-40°C)

■AT NORMAL TEMPERATURE (25°C)

■AT HIGH TEMPERATURE (150°C)

SEMICONDUCTOR DEVICE AND POWER CONVERSION DEVICE

BACKGROUND OF THE INVENTION

Field

The present invention relates to a semiconductor device and a power conversion device.

Background

Japanese Patent Application Laid-open No. 2016-103901 discloses a power module equipped with a thermistor. The thermistor detects the temperature of a cooling medium flowing through a flow passage formed inside a power conversion device.

When determining the temperature of a power device chip using a thermistor, typically, the chip temperature is estimated from the ambient temperature of the chip. That is, generally speaking, as long as a thermistor is used, it is not possible to detect the temperature of the chip itself. Another possible method of determining a chip temperature is to use a temperature sensor diode, for example. This method, however, would require addition of a temperature sensor diode to the chip, resulting in an increase in the number of components built in the chip.

SUMMARY

The present invention was made to solve the problem described above and it is an object of the invention to provide a semiconductor device and a power conversion device that enable detection of the temperature of a semiconductor chip itself while avoiding an increase in the number of components of the semiconductor chip.

The features and advantages of the present invention may be summarized as follows.

According to the present invention, a semiconductor device includes a semiconductor chip, resistance of which changes in accordance with temperature, an external resistor connected in series with the semiconductor chip and a detector configured to detect, while a first voltage is applied between both ends of a series circuit formed by the semiconductor chip and the external resistor, a second voltage applied between both ends of the external resistor, wherein the detector calculates a temperature of the semiconductor chip from the second voltage.

Other and further objects, features and advantages of the invention will appear more fully from the following description.

DESCRIPTION OF EMBODIMENTS

Figure 1:
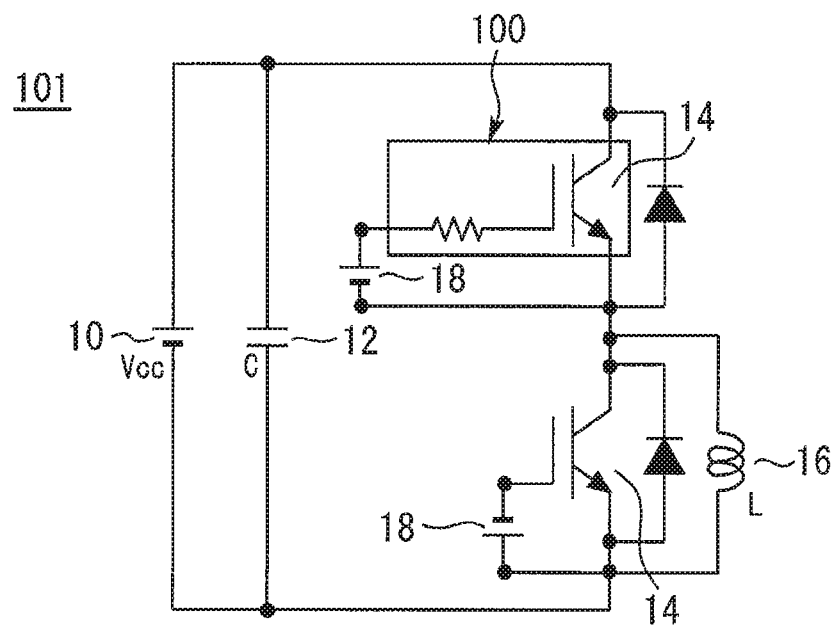
FIG. 1 is a diagram illustrating a power conversion device according to a first embodiment.

A semiconductor device and a power conversion device according to embodiments of the present invention will be described with reference to the accompanying drawings. Components identical or corresponding to each other are indicated by the same reference characters, and repeated description of them is avoided in some cases.

First Embodiment

FIG. 1 is a diagram illustrating a power conversion device 101 according to a first embodiment. The power conversion device 101 includes two semiconductor chips 14 connected in series to configure a half bridge circuit. The semiconductor chips 14 are power device chips such as insulated gate bipolar transistors (IGBTs) or the like, for example.

A capacitor 12 is connected in parallel with a power supply 10 in the power conversion device 101. The series circuit formed by the two semiconductor chips 14 is connected in parallel with the capacitor 12. A free-wheeling diode is connected to each of the semiconductor chips 14. Driver power supplies 18 apply a gate-emitter voltage to respective semiconductor chips 14 to drive the semiconductor chips 14.

An external resistor to be described below is connected between the driver power supply 18 and the gate terminal of one of the two semiconductor chips 14. A transformer 16 is connected between a connection point of the two semiconductor chips 14 and a negative electrode of the capacitor 12. The driver power supplies 18 switch on the two semiconductor chips 14 alternately, whereby a voltage is generated in the transformer 16.

Figure 2:
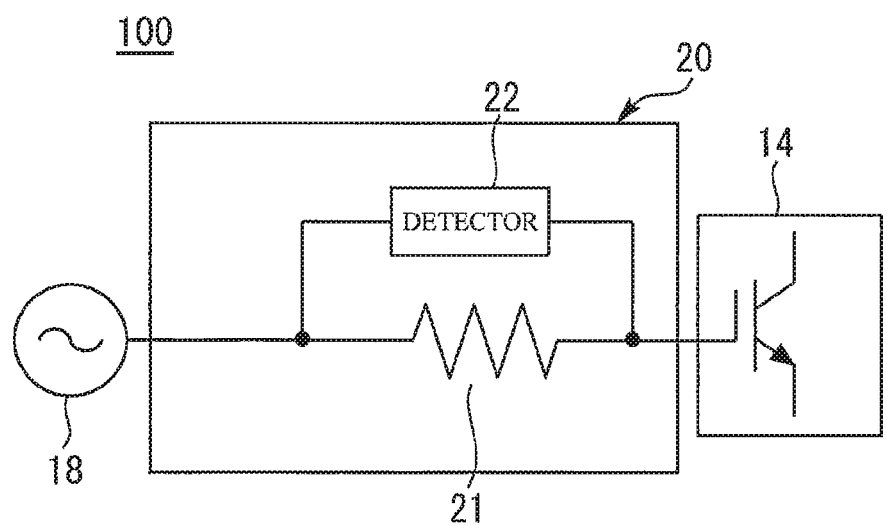
FIG. 2 is a diagram illustrating a semiconductor device according to the first embodiment.

FIG. 2 is a diagram illustrating a semiconductor device 100 according to the first embodiment. The semiconductor device 100 includes the semiconductor chip 14 and an external device 20. The external device 20 is connected between the gate terminal of the semiconductor chip 14 and the driver power supply 18. The external device 20 has an external resistor 21 and a detector 22.

One end of the external resistor 21 is connected to the driver power supply 18, while the other end is connected to the gate terminal of the semiconductor chip 14. The external resistor 21 is connected in series with the semiconductor chip 14. The detector 22 is connected in parallel with the external resistor 21.

The driver power supply 18 is an AC power supply. This is not necessarily so, and the driver power supply 18 may output a pulse signal, pulse width modulation (PWM) signal, a square wave, and the like. The driver power supply 18 provides a first voltage between both ends of the series circuit formed by the semiconductor chip 14 and the external resistor 21. The semiconductor chip 14 switches when the first voltage is supplied.

The detector 22 detects, while the first voltage is applied between both ends of the series circuit formed by the semiconductor chip 14 and the external resistor 21, a second voltage applied between both ends of the external resistor 21. The second voltage detected by the detector 22 is a value obtained by dividing the first voltage supplied by the driver power supply 18 by resistances of the external resistor 21 and an internal resistor of the semiconductor chip 14.

The semiconductor chip 14 includes therein an internal resistor having a temperature coefficient. Namely, the resistance of the semiconductor chip 14 changes in accordance with the temperature. The internal resistance of the semiconductor chip 14 may be a parasitic resistance that is inherently generated when the chip is formed, or provided by a resistor device built inside the chip.

The detector 22 calculates a voltage applied to the internal resistor of the semiconductor chip 14 from the first voltage and the detected second voltage. The detector 22 also calculates the internal resistance of the semiconductor chip 14 from the second voltage, the voltage applied to the internal resistor of the semiconductor chip 14, and the resistance of the external resistor 21. Further, the detector 22 calculates the temperature of the semiconductor chip 14 from a relationship between the calculated internal resistance of the semiconductor chip 14 and the chip temperature.

Preferably, the external resistor 21 should provide resistance that varies less relative to temperature changes than that of the internal resistor of the semiconductor chip 14. An external resistor 21 having a temperature coefficient that is close to zero may preferably be used. The external resistor 21 is, for example, an axial lead resistor. Carbon film resistors with a carbon coating, or metal film resistors having a metal film of NiCr or the like deposited thereon, can be used as the external resistor 21.

It can be seen from the above that, according to this embodiment, the temperature of the semiconductor chip 14 itself can be calculated using a voltage division ratio given by the external resistor 21 and the internal resistor of the semiconductor chip 14. This also means that the chip temperature can be calculated without adding an on-chip diode or the like to the semiconductor chip 14. Thus the temperature of the semiconductor chip 14 itself can be determined without causing an increase in the number of components of the semiconductor chip 14. Since the power conversion device 101 does not use any thermistors or temperature sensor diodes and the like, which are generally small relative thereto, the device assemblability and productivity can be improved.

According to this embodiment, the temperature detection feature can be added easily by merely connecting the external device 20 between the half bridge circuit and the driver power supply 18. This allows the half bridge circuit to be standardized whether or not there is the temperature detection feature. Accordingly, an increase in the number of steps and the costs caused by addition of the temperature detection feature can be minimized. The external device 20 may be provided detachably to the gate terminal of the semiconductor chip 14. The external device 20 may be provided outside a case housing a plurality of semiconductor chips 14 forming a half bridge circuit and a substrate and the like, for example.

In this embodiment, the detector 22 detects a second voltage to calculate the temperature of the semiconductor chip 14. This is not necessarily so and the detector 22 only need to detect at least the second voltage. That is, the temperature of the semiconductor chip 14 may be calculated by an external device or a user, using the second voltage detected by the detector 22.

The power conversion device 101 is not limited to the one shown in FIG. 1, and may be an inverter or the like. The power conversion device 101 only need to be a circuit having at least one semiconductor chip 14.

The semiconductor chip 14 and the free-wheeling diode may be formed by wide-band-gap semiconductors. Wide-band-gap semiconductors are made of silicon carbide- or gallium nitride-based materials, or diamond, for example.

Switching devices and diode devices formed from wide-band-gap semiconductors generally have a high breakdown voltage and a high permissible current density. The semiconductor chips 14 and the free-wheeling diodes can therefore be configured smaller. Use of smaller semiconductor chips 14 and the free-wheeling diodes enables downsizing of the semiconductor device 100 and the power conversion device 101.

Moreover, switching devices and diode devices formed from wide-band-gap semiconductors generally have a low power loss, which allows the semiconductor chips 14 and the free-wheeling diodes to be more efficient. This in turn makes the semiconductor device 100 and the power conversion device 101 more efficient.

These modifications can be appropriately applied to semiconductor devices and power conversion devices according to embodiments below. Meanwhile, for the semiconductor devices and the power conversion devices according to the embodiments below, dissimilarities with the first embodiment will mainly be explained as they have many similarities with the first embodiment.

Second Embodiment

Figure 3:
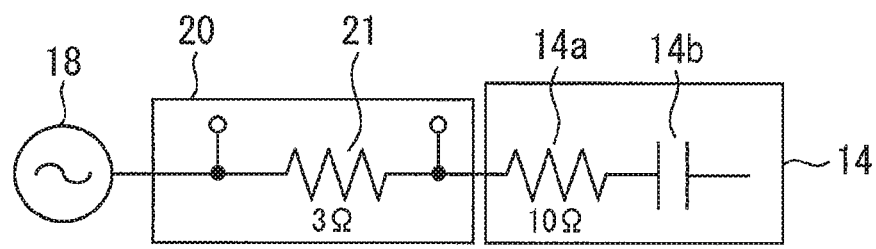
FIG. 3 is a diagram illustrating how resistance of a semiconductor chip according to a second embodiment changes with the temperature.
Figure 3:
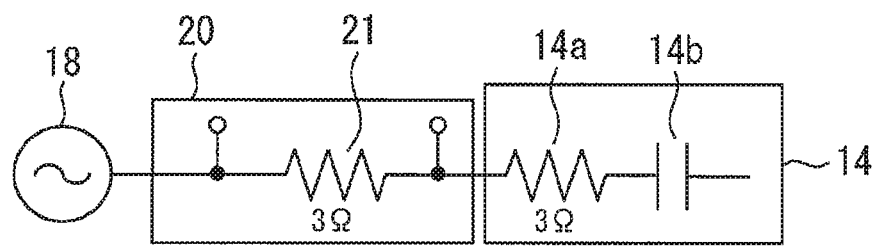
Figure 3:
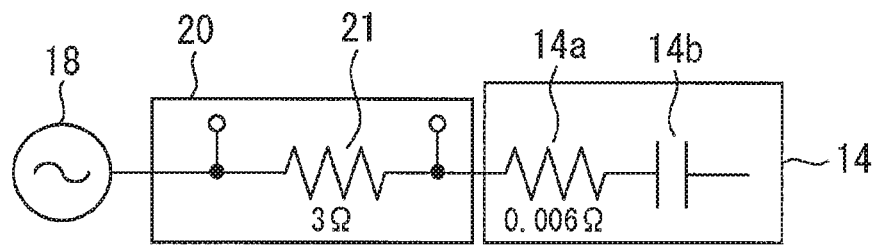

FIG. 3 is a diagram illustrating how the resistance of the semiconductor chip 14 according to a second embodiment changes with the temperature. The detector 22 is not shown in FIG. 3. In this embodiment, the resistance of the semiconductor chip 14 increases with a decrease in the temperature of the semiconductor chip 14. As shown in FIG. 3, the semiconductor chip 14 has an internal resistor 14a and a device capacitance 14b. For example, the internal resistor 14a has resistance of 10Ω at a low temperature of −40° C., 3Ω at a normal temperature of 25° C., and 0.006Ω at a high temperature of 150° C. The external resistor 21 has resistance of 3Ω, for example.

Generally, the tail current increases at high temperatures in semiconductor chips such as IGBTs. There is a possibility therefore that the switching rate may be lowered at high temperatures, leading to an increase in switching loss. In this embodiment, the internal resistance of the semiconductor chip 14 is reduced at high temperatures. Generally, the smaller the internal resistance, the higher the switching rate. Therefore, the switching rate reduction and switching loss at high temperatures can be minimized.

Figure 4:
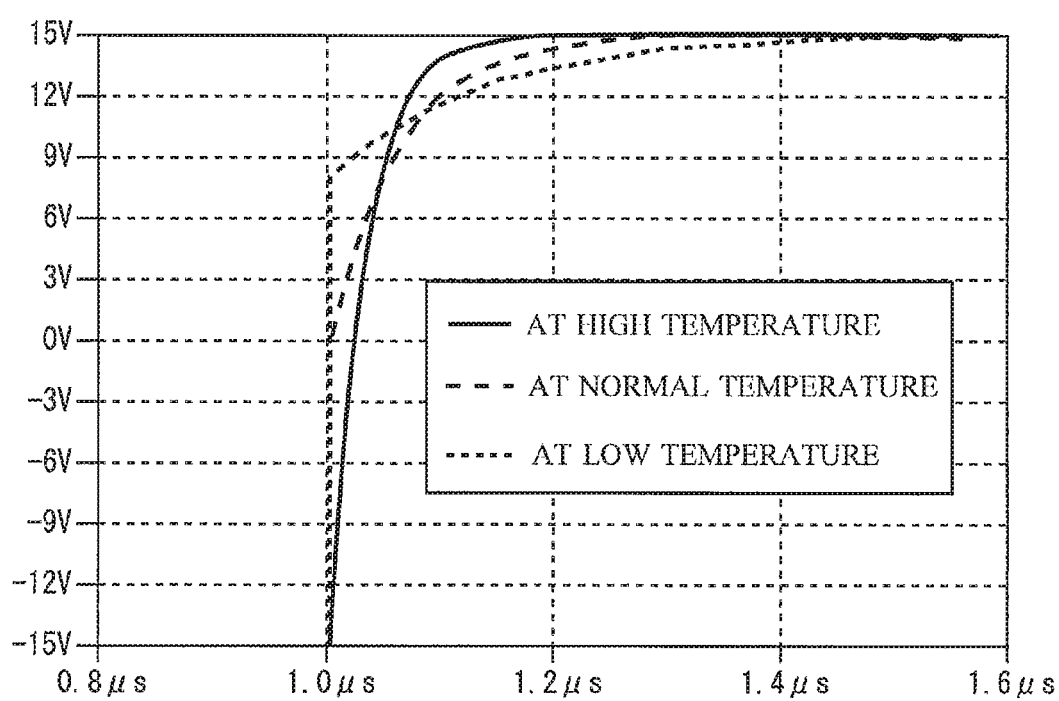
FIG. 4 is a diagram showing a voltage waveform at the start of switching of the semiconductor chip according to the second embodiment.

FIG. 4 is a diagram showing a voltage waveform at the start of switching of the semiconductor chip 14 according to the second embodiment. FIG. 4 shows simulation results of gate-emitter voltage waveforms immediately after the semiconductor chip 14 switches. The gate-emitter voltage waveform varies in accordance with the temperature. Therefore, the temperature of the semiconductor chip 14 can be estimated from the voltage waveform immediately after the turn-on.

The detector 22 may calculate the temperature of the semiconductor chip 14 from a time it takes for the voltage applied to the semiconductor chip 14 to reach a preset level after the start of switching. More specifically, the detector 22 may calculate the temperature of the semiconductor chip 14 from the time it takes for the gate-emitter voltage to reach 3V from −15V.

Alternatively, the detector 22 may calculate the temperature of the semiconductor chip 14 from a slope of a gate-emitter voltage curve at the start of switching.

At the start of the turn-on, the gate-emitter voltage of the semiconductor chip 14 rises in accordance with a time constant determined by the internal resistor 14a and the device capacitance 14*b*. In this embodiment, the resistance of the internal resistor 14*a* varies in accordance with the chip temperature. Accordingly, the time until the gate-emitter voltage settles to a constant value changes in accordance with the chip temperature. The detector 22 may calculate the temperature of the semiconductor chip 14 from the time it takes for the gate-emitter voltage of the semiconductor chip 14 to settle to a preset level after the start of switching. The detector 22 includes a timer so that it detects the time from the start of the turn-on until the gate-emitter voltage settles to a constant level, using the timer.

Third Embodiment

Figure 5:
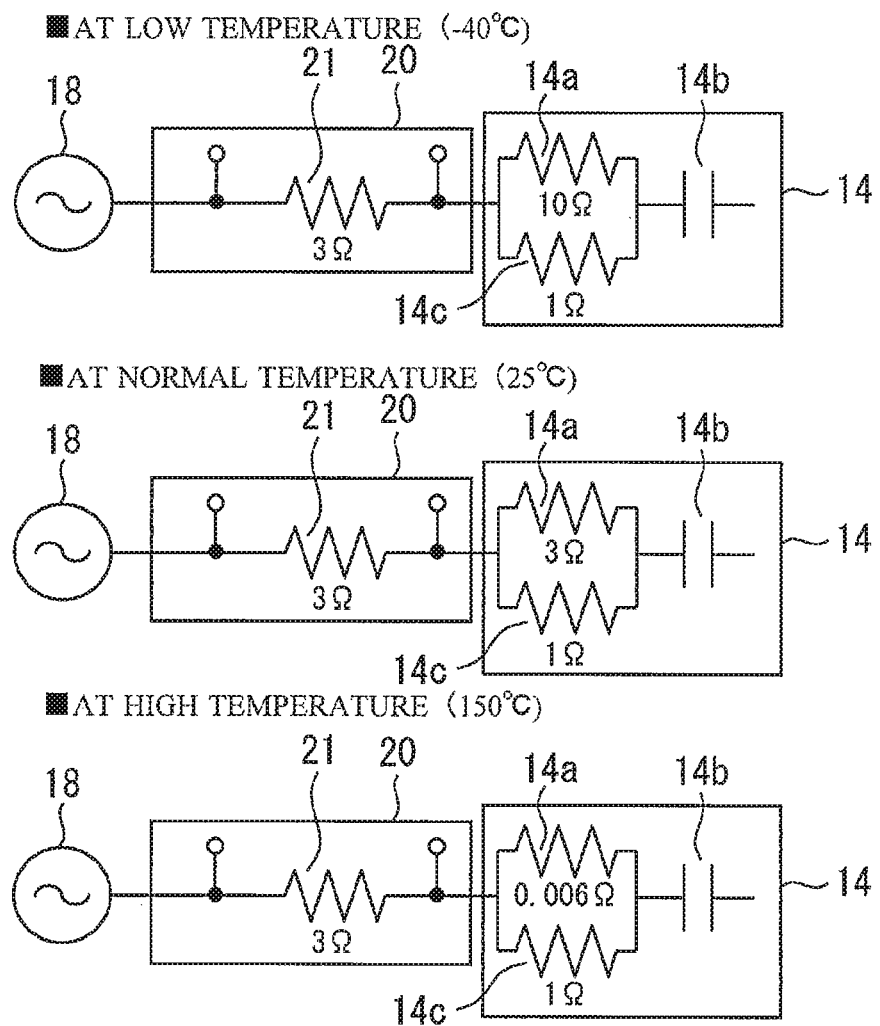
FIG. 5 is a diagram illustrating how resistance of a semiconductor chip according to a third embodiment changes with the temperature.

FIG. 5 is a diagram illustrating how the resistance of the semiconductor chip 14 according to a third embodiment changes with the temperature. The semiconductor chip 14 includes a plurality of internal resistors 14*a* and 14*c* connected in parallel. In this embodiment, the resistance of the semiconductor chip 14 corresponds to the resistances of the plurality of internal resistors 14*a* and 14*c*. The internal resistor 14*c* provides resistance that varies less relative to temperature changes than that of the internal resistor 14*a*. As described above in the second embodiment, the internal resistor 14*a* has a negative temperature coefficient. The temperature coefficient of the internal resistor 14*c* is substantially zero. The resistance of the internal resistor 14*c* is about 1Ω in a temperature range of −40° C. to +150° C., for example.

A semiconductor chip having a temperature coefficient may exhibit high resistance depending on the temperature. In this embodiment, a current can be conducted via the internal resistor 14*c* at low temperatures when the internal resistor 14*a* has high resistance. Thus the resistance increase of the semiconductor chip 14 caused by a temperature change can be minimized.

In this embodiment, the internal resistor 14*c* has a temperature coefficient that is almost zero. This is not necessarily so and the internal resistor 14*c* may have any resistance value as long as it varies less relative to temperature changes than the resistance of the internal resistor 14*a*, and as long as it is smaller than the resistance of the internal resistor 14*a* at least in a certain temperature range. A resistor that is the same as the internal resistor 14*a* may also be used as the internal resistor 14*c*. By connecting the internal resistors 14*a* and 14*c* in parallel, a rise of combined resistance as a result of increased resistances of discrete resistors can be mitigated. The semiconductor chip 14 may also include three or more internal resistors connected in parallel.

Fourth Embodiment

Figure 6:
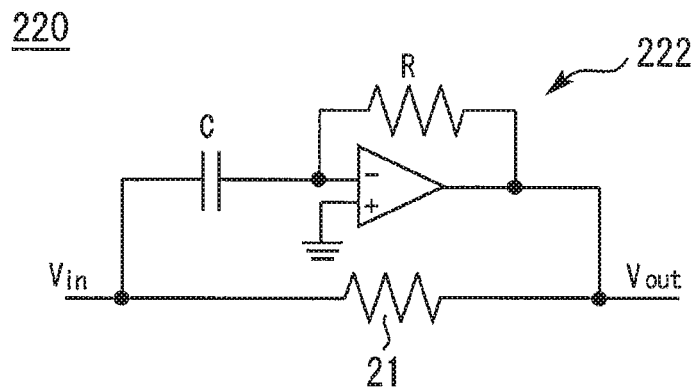
FIG. 6 is a diagram illustrating an external device according to a fourth embodiment.

FIG. 6 is a diagram illustrating an external device 220 according to a fourth embodiment. The external device 220 has a detector 222. The detector 222 includes a differentiating circuit. The differentiating circuit is designed such that its output is the derivative of its input. Therefore, the detector 222 can detect a peak value of the second voltage. The detector 222 calculates a voltage division ratio given by the external resistor 21 and the internal resistor of the semiconductor chip 14 from the peak value of the second voltage. The temperature of the semiconductor chip 14 can thus be determined easily.

The technical features described in the foregoing embodiments can be used in various combinations as required.

The semiconductor device according to the present invention can determine resistance of a semiconductor chip by detecting a second voltage applied to an external resistor, and consequently, can calculate the temperature of the semiconductor chip from a relationship between the resistance and the temperature.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2018-129834, filed on Jul. 9, 2018 including specification, claims, drawings and summary, on which the Convention priority of the present application is based, are incorporated herein by reference in its entirety.

The invention claimed is:

1. A semiconductor device, comprising:
a semiconductor chip, resistance of which changes in accordance with temperature, the semiconductor chip including a switch having a gate terminal;
an external resistor connected to the gate terminal in series with the semiconductor chip; and
a detector configured to detect, while a first voltage is applied between both ends of a series circuit formed by the semiconductor chip and the external resistor, a second voltage present between both ends of the external resistor, wherein
the detector is coupled across the ends of the external resistor to calculate a temperature of the semiconductor chip from the second voltage.

2. The semiconductor device according to claim 1, wherein the switch of the semiconductor chip switches when the first voltage is supplied to the series circuit.

3. The semiconductor device according to claim 2, wherein the detector calculates the temperature of the semiconductor chip from a time it takes for a voltage applied to the semiconductor chip to reach a preset level after a start of switching.

4. The semiconductor device according to claim 2, wherein the detector calculates the temperature of the semiconductor chip from a slope of a voltage curve of a voltage applied to the semiconductor chip at a start of switching.

5. The semiconductor device according to claim 2, wherein the detector calculates the temperature of the semiconductor chip from a time it takes for a voltage applied to the semiconductor chip to settle to a preset level after a start of switching.

6. The semiconductor device according to claim 1, wherein the detector includes a differentiating circuit and detects a peak value of the second voltage.

7. The semiconductor device according to claim 1, wherein the resistance of the semiconductor chip increases with a decrease in temperature of the semiconductor chip.

8. The semiconductor device according to claim 1, wherein the semiconductor chip includes a plurality of internal resistors connected in parallel, the resistance of the semiconductor chip being resistances of the plurality of internal resistors.

9. The semiconductor device according to claim 8, wherein the plurality of internal resistors include a first resistor, and a second resistor having resistance that varies less relative to temperature changes than that of the first resistor,
the second resistor having resistance smaller than that of the first resistor at least in one temperature range.

10. The semiconductor device according to claim 1, wherein the semiconductor chip is formed by a wide-bandgap semiconductor.

11. The semiconductor device according to claim 10, wherein the wide-band-gap semiconductor is made of silicon carbide, gallium nitride, or diamond.

12. A power conversion device comprising the semiconductor device according to claim 1.

13. A semiconductor device, comprising:
   a semiconductor chip, resistance of which changes in accordance with temperature;
   an external resistor connected in series with the semiconductor chip; and
   a detector configured to detect, while a first voltage is applied between both ends of a series circuit formed by the semiconductor chip and the external resistor, a second voltage present between both ends of the external resistor, wherein
   the detector is coupled across the ends of the external resistor to calculate a temperature of the semiconductor chip from the second voltage, and
   the semiconductor chip includes a plurality of internal resistors connected in parallel, the resistance of the semiconductor chip being resistances of the plurality of internal resistors.

14. The semiconductor device according to claim 13, wherein the plurality of internal resistors include a first resistor, and a second resistor having resistance that varies less relative to temperature changes than that of the first resistor,
   the second resistor having resistance smaller than that of the first resistor at least in one temperature range.

* * * * *